US006974994B1

(12) United States Patent
Kuo et al.

(10) Patent No.: US 6,974,994 B1
(45) Date of Patent: Dec. 13, 2005

(54) CAPACITOR WITH A GEOMETRICAL LAYOUT

(75) Inventors: Chun-Hsien Kuo, Tainan (TW); Tai-Haur Kuo, Tainan (TW)

(73) Assignee: Advanic Technologies Inc., (TW)

( * ) Notice: Subject to any disclaimer, the term of this patent is extended or adjusted under 35 U.S.C. 154(b) by 0 days.

(21) Appl. No.: 10/873,709

(22) Filed: Jun. 22, 2004

(51) Int. Cl.[7] .................................... H01L 29/76
(52) U.S. Cl. ...................... 257/308; 257/298; 257/301; 257/304; 257/306; 257/307; 257/309
(58) Field of Search ................................ 257/306, 307, 257/308, 309, 304, 301, 298

(56) References Cited

U.S. PATENT DOCUMENTS 5,340,763 A * 8/1994 Dennison .................... 438/396
6,215,187 B1 * 4/2001 Ooto et al. ................. 257/758
6,410,955 B1 * 6/2002 Baker et al. ................ 257/307
6,576,946 B1 * 6/2003 Kanai et al. ................ 257/306
6,888,217 B2 * 5/2005 Gilgen et al. ............... 257/532

* cited by examiner

*Primary Examiner*—Christian D. Wilson
*Assistant Examiner*—Douglas Menz
(74) *Attorney, Agent, or Firm*—Ostrolenk, Faber, Gerb & Soffen, LLP

(57) ABSTRACT

A capacitor includes an array of first conductive units and an array of second conductive units. Each of the first conductive units includes a hollow first conductive post that has lateral sides. The first conductive posts of the first conductive units are interconnected to form a grid that defines a plurality of lattices. Each of the second conductive units includes a second conductive post that is disposed in a respective one of the lattices and that has lateral sides that are surrounded by the lateral sides of the first conductive post of a respective one of the first conductive units. The first conductive post of each of the first conductive units and the second conductive post of the respective one of the second conductive units cooperatively define a charge space. A dielectric material fills the charge space.

7 Claims, 8 Drawing Sheets

CAPACITOR WITH A GEOMETRICAL LAYOUT

BACKGROUND OF THE INVENTION

1. Field of the Invention

This invention relates to a capacitor, more particularly to a capacitor with a geometrical layout of a grid of first conductive posts and a plurality of second conductive posts disposed respectively in lattices of the grid.

2. Description of the Related Art

FIG. 1 illustrates a conventional capacitor that includes a dielectric layer 13 sandwiched between first and second external electrodes 11, 12. The capacitance of the conventional capacitor depends on the areas of the first and second external electrodes 11, 12, the distance between the first and second external electrodes 11, 12, and the material of the dielectric layer 13. Particularly, the larger the areas of the first and second external electrodes 11, 12, or the smaller the distance between the first and second external electrodes 11, 12, the higher will be the capacitance.

The conventional capacitor is disadvantageous in that enlarging the areas of the first and second external electrodes 11, 12 for increasing the capacitance of the capacitor results in an undesired increase in the size of the capacitor, which contradicts the current trend in the manufacturing industry for miniaturization of electronic or electrical devices, and that reducing the distance between the first and second external electrodes 11, 12 for increasing the capacitance of the capacitor results in a complex manufacturing process and a considerable increase in manufacturing cost.

SUMMARY OF THE INVENTION

The object of the present invention is to provide a capacitor with a geometrical layout that can overcome the aforesaid drawbacks of the prior art.

According to this invention, a capacitor comprises: a first level structure including an array of first conductive units and an array of second conductive units. Each of the first conductive units includes a hollow first conductive post that has a plurality of lateral sides. The first conductive posts of the first conductive units are interconnected to form a grid that defines a plurality of lattices. Each of the second conductive units includes a second conductive post that is disposed in a respective one of the lattices and that has a plurality of lateral sides that are surrounded by the lateral sides of the first conductive post of a respective one of the first conductive units. The first conductive post of each of the first conductive units and the second conductive post of the respective one of the second conductive units cooperatively define a charge space therebetween. A dielectric material fills the charge space.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
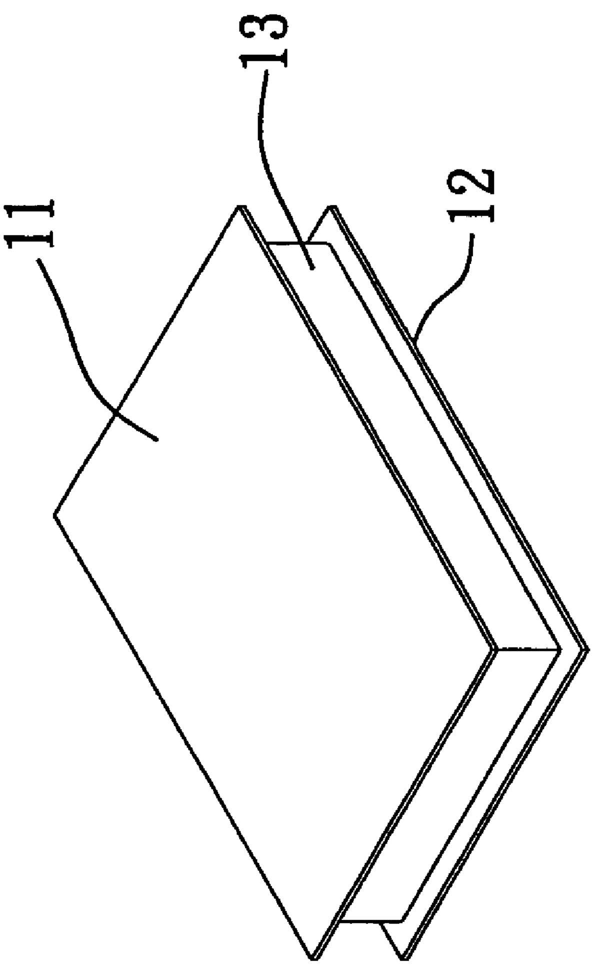
FIG. 1 is a perspective view of a conventional capacitor.

Before the present invention is described in greater detail, it should be noted that same reference numerals have been used to denote like elements throughout the specification.

Figure 2:
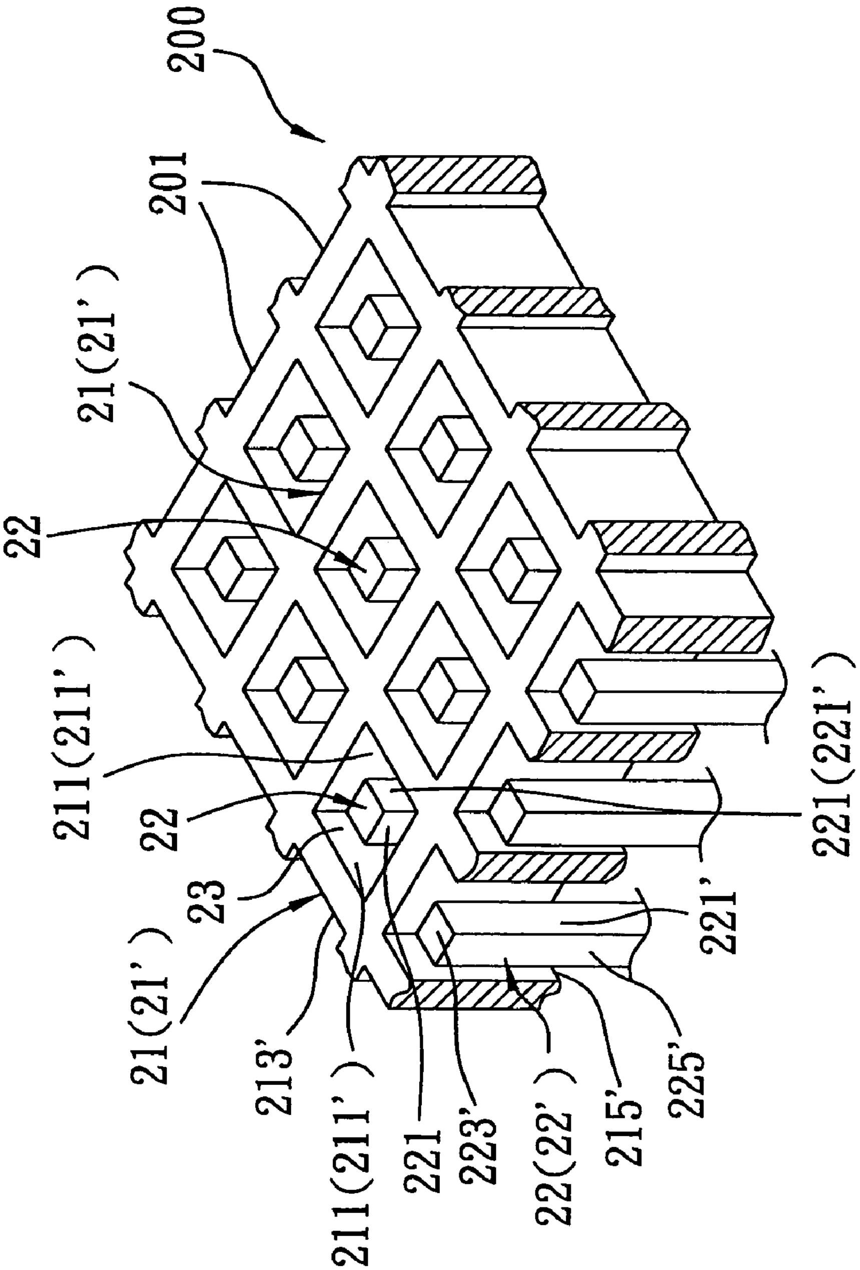
FIG. 2 is a fragmentary perspective view of the first preferred embodiment of a capacitor according to this invention, with a dielectric material removed from charge spaces.
Figure 3:
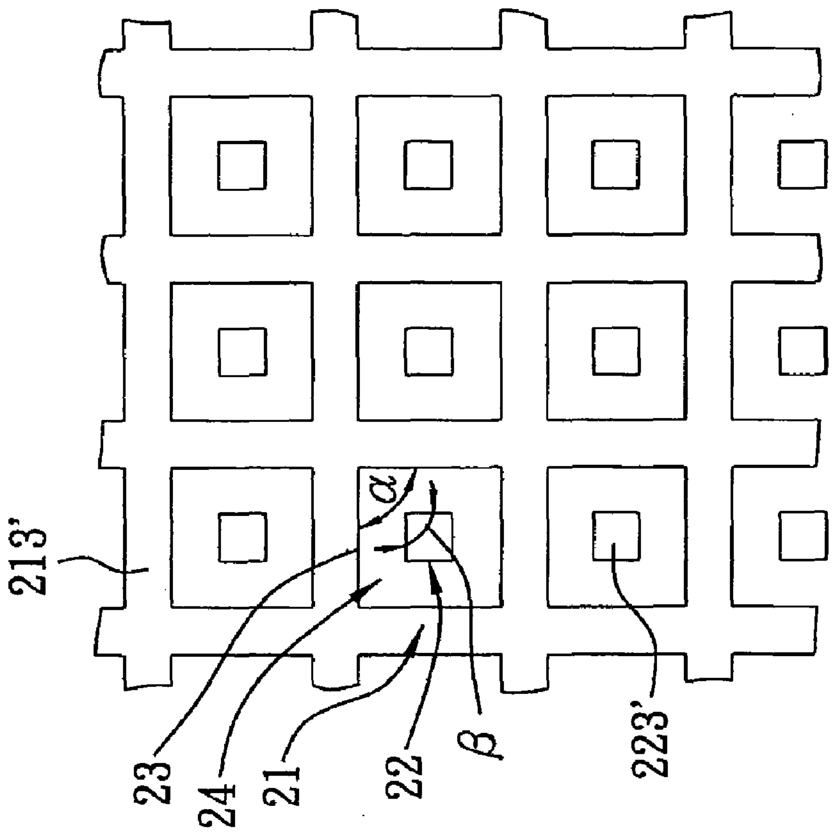
FIG. 3 is a fragmentary top view of the first preferred embodiment, with the dielectric material filled in the charge spaces.
Figure 4:
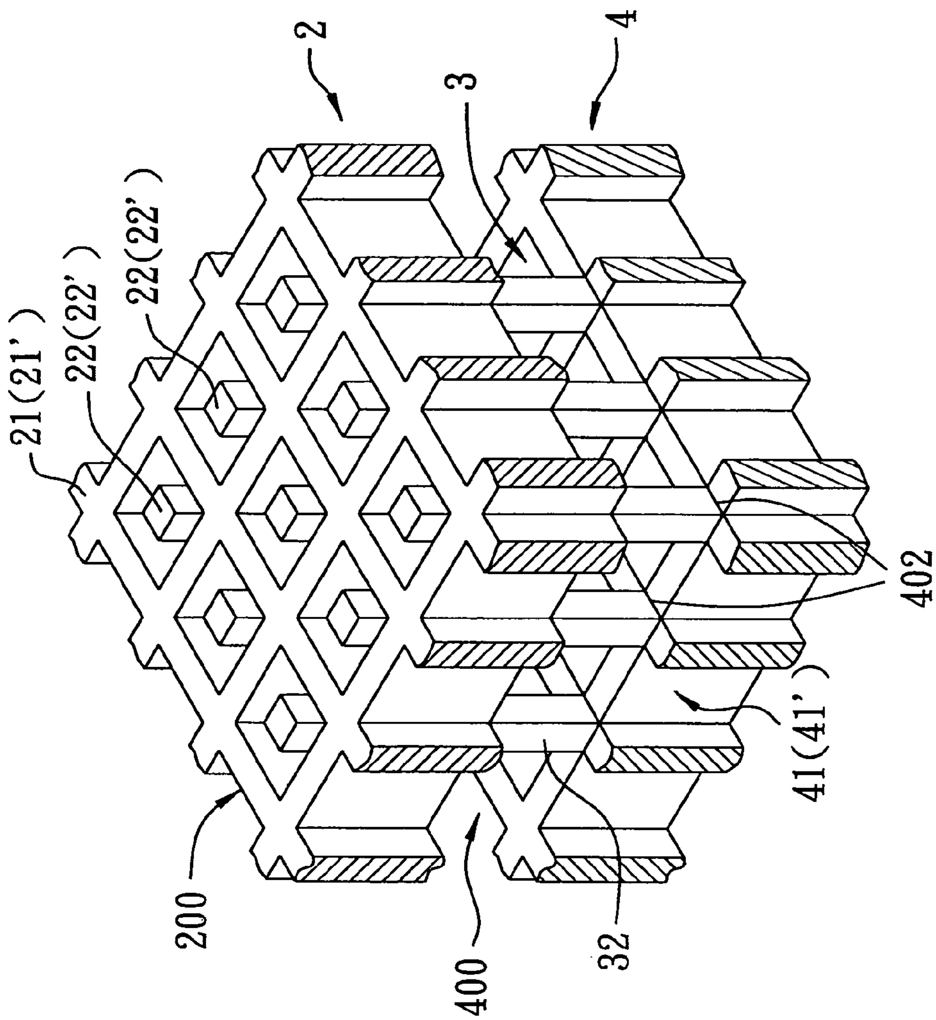
FIG. 4 is a fragmentary perspective view of the second preferred embodiment of the capacitor according to this invention, with a dielectric material removed therefrom.
Figure 5:
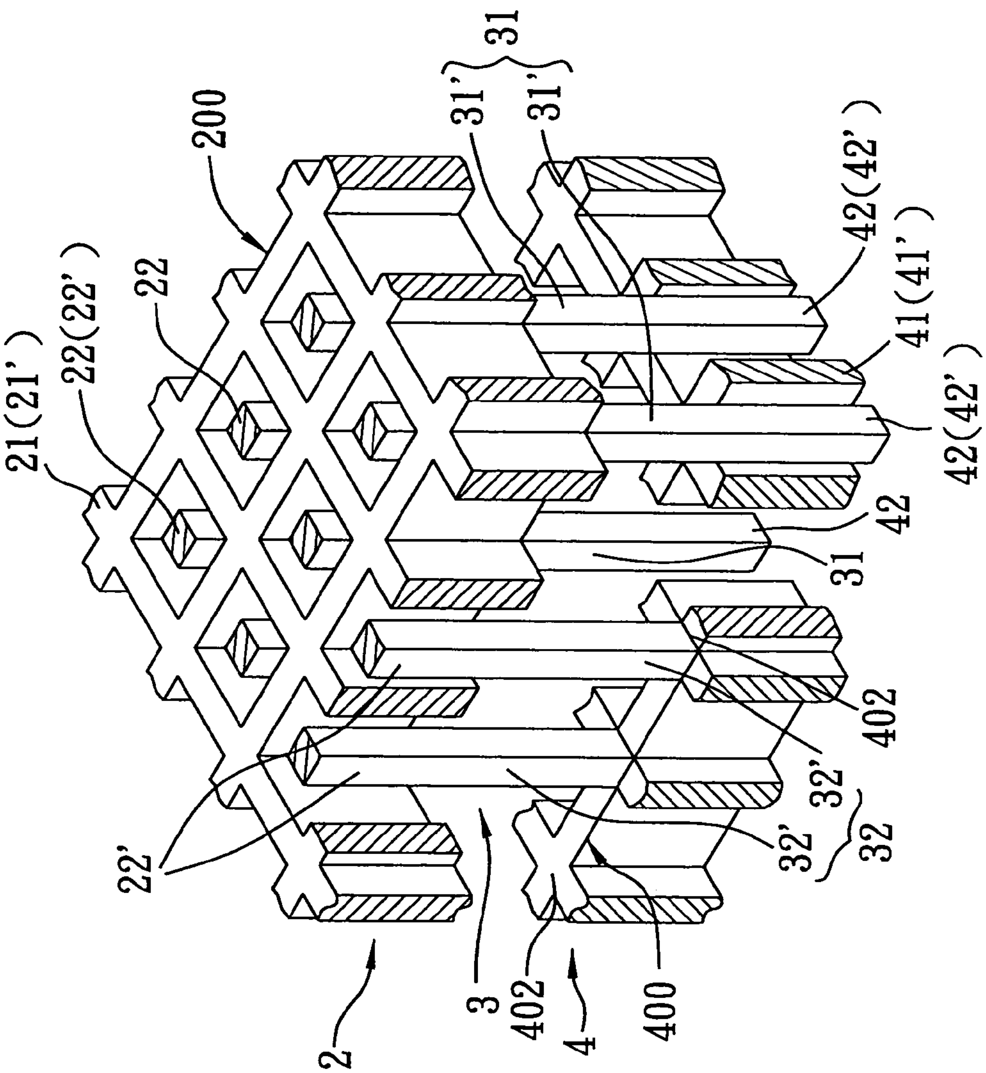
FIG. 5 is a fragmentary cutaway view of the second preferred embodiment.
Figure 6:
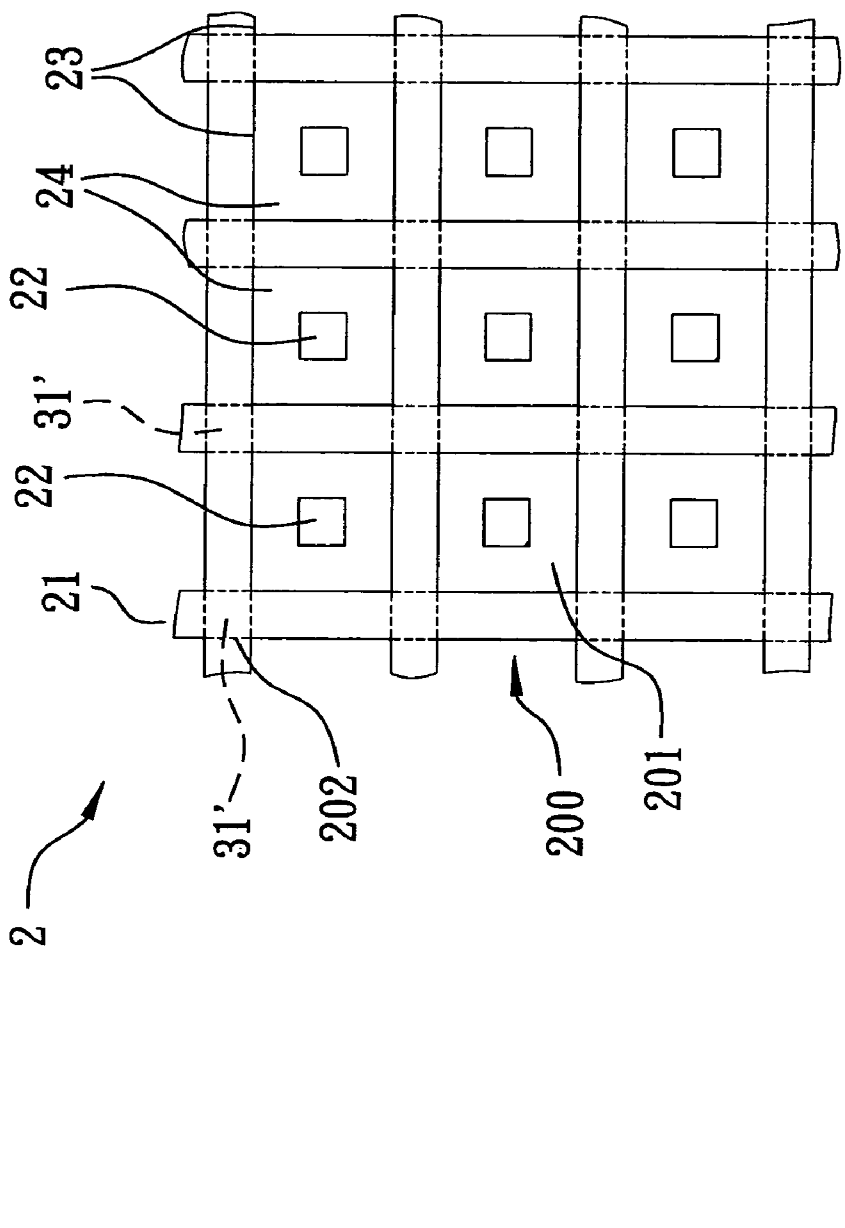
FIG. 6 is a fragmentary top view of a first level structure of the capacitor of the second preferred embodiment.
Figure 7:
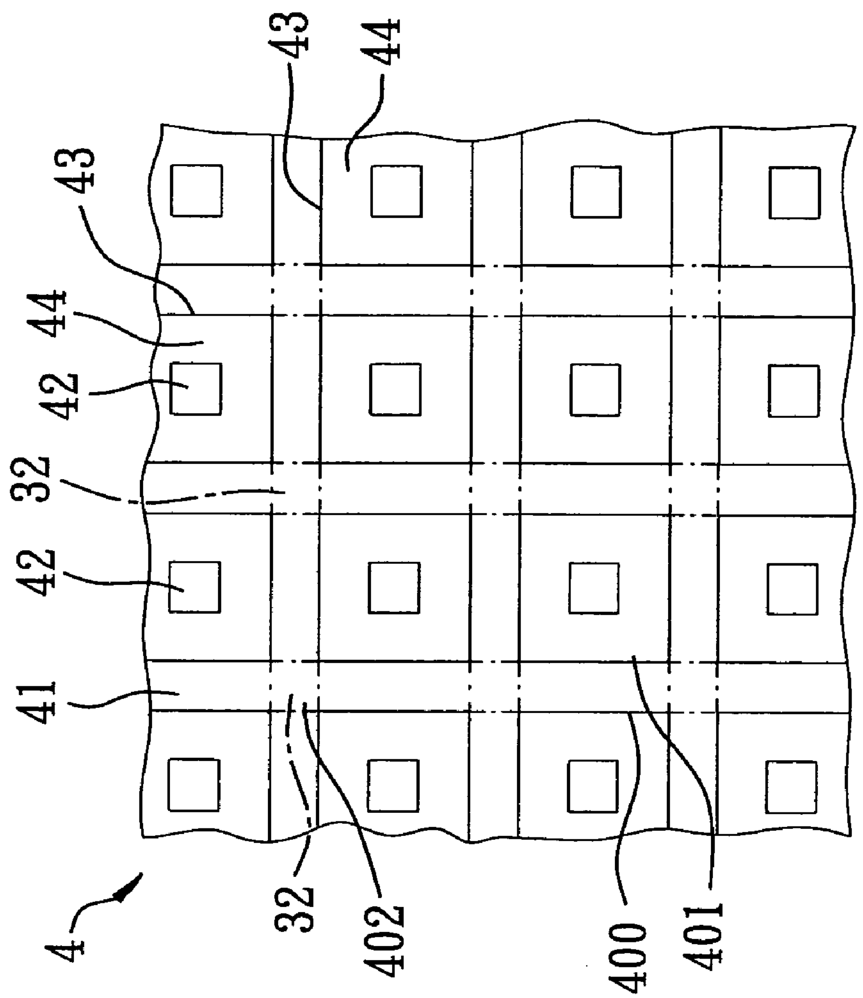
FIG. 7 is a fragmentary bottom view of a second level structure of the capacitor of the second preferred embodiment.
Figure 8:
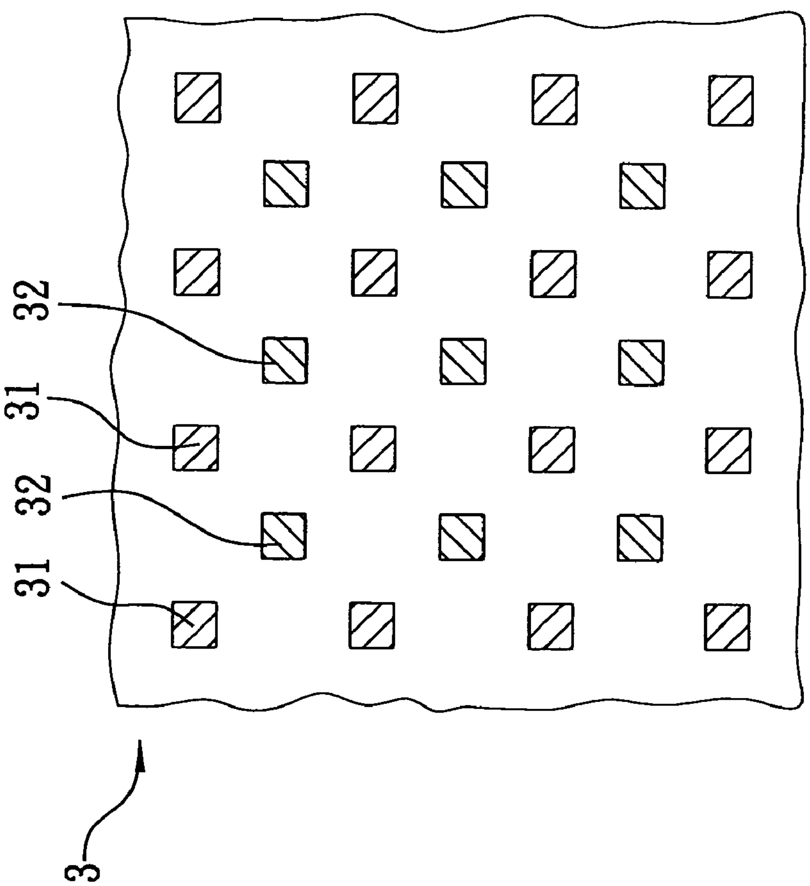
FIG. 8 is a fragmentary sectional view to illustrate the configuration of a middle level structure of the capacitor of the second preferred embodiment.

FIGS. 2 and 3 illustrate the first preferred embodiment of a capacitor with a geometrical layout according to this invention.

The capacitor includes: an array of first conductive units 21, each of which has a plurality of first sides 211, at least an adjacent pair of the first sides 211 being joined to each other and forming an angle ($\alpha$) less than 180 degree; an array of second conductive units 22, each of which has a plurality of second sides 221 that are surrounded by the first sides 211 of a respective one of the first conductive units 21, each of the second sides 221 being spaced apart from and confronting a respective one of the first sides 211 of the respective first conductive unit 21, at least an adjacent pair of the second sides 221 being joined to each other and forming an angle ($\beta$) less than 180 degree, the adjacent pair of the second sides 221 confronting respectively the adjacent pair of the first sides 211 of the respective first conductive unit 21, each of the first conductive units 21 and the respective one of the second conductive units 22 cooperatively defining a charge space 23 therebetween, the charge space 23 surrounding the second sides 221; and a dielectric material 24 filling the charge space 23.

In this embodiment, each of the first conductive units 21 includes a hollow first conductive post 21' that is rectangular in cross-section and that has top and bottom ends 213', 215' and four lateral sides 211' extending from the top end 213' to the bottom end 215' and defining the first sides 211 of the first conductive unit 21. The first conductive posts 21' are interconnected to form a grid 200 that defines a plurality of rectangular lattices 201. Each of the second conductive units 22 includes a second conductive post 22' that is disposed in a respective one of the lattices 201, that is rectangular in cross-section, and that has top and bottom ends 223', 225' and four lateral sides 221' extending from the top end 223' of the second conductive post 22' to the bottom end 225' of the second conductive post 22' and defining the second sides 221 of the second conductive unit 22. Note that each lattice 201 of the grid 200 can be triangular, hexagonal, polygonal, etc. in other embodiments of this invention. The cross-section of each of the second conductive posts 22' preferably has a shape corresponding to that of the corresponding lattice 201 of the grid 200.

FIGS. 4 to 8 illustrate the second preferred embodiment of the capacitor according to this invention. The capacitor of this embodiment includes a multi-level structure that has first and second level structures 2, 4, and a middle structure 3 interposed between the first and second level structures 2, 4. In this embodiment, the first and second level structures 2, 4 have a configuration similar to that of the first embodiment.

The first level structure 2 includes: an array of the first conductive units 21 and an array of the second conductive units 22 similar to those of the previous embodiment, each of the first conductive units 21 and the respective one of the second conductive units 22 cooperatively defining a first level charge space 23 therebetween; and a first level dielectric material 24 filling the first level charge space 23.

The second level structure 4 is disposed below the first level structure 2, and includes: an array of third conductive units 41 and an array of fourth conductive units 42 similar to the first and second conductive units 21, 22 of the previous embodiment, each of the third conductive units 41 and the respective one of the fourth conductive units 42 cooperatively defining a second level charge space 43 therebetween; and a second level dielectric material 44 filling the second level charge space 43.

The middle level structure 3 includes: a conductive first connecting unit 31 that is connected electrically to the first and fourth conductive units 21, 42; and a conductive second connecting unit 32 that is connected electrically to the second and third conductive units 22, 41.

In this embodiment, each of the first conductive units 21 includes a hollow first conductive post 21' similar to that of the previous embodiment. The first conductive posts 21' are interconnected to form a first level grid 200 that defines a plurality of rectangular first level lattices 201. Each of the second conductive units 22 includes a second conductive post 22' that is similar to that of the previous embodiment and that is disposed in a respective one of the first level lattices 201 of the first level grid 200. Each of the third conductive units 41 includes a hollow third conductive post 41' similar to the first conductive post 21' of the previous embodiment. The third conductive posts 41' are interconnected to form a second level grid 400 that defines a plurality of rectangular second level lattices 401. Each of the fourth conductive units 42 includes a fourth conductive post 42' that is similar to the second conductive post 22' of the previous embodiment and that is disposed in a respective one of the second level lattices 401 of the second level grid 400. Note that the first and third conductive units 21, 41 and/or the second and fourth conductive units 22, 42 can have different configurations.

Each of the first and second level grids 200, 400 defines a plurality of intersections 202, 402. Each intersection 202 of the first level grid 200 is vertically aligned with a center of a respective one of the lattices 401 of the second level grids 400. Each intersection 402 of the second level grid 400 is vertically aligned with a center of a respective one of the lattices 201 of the first level grids 200.

The first connecting unit 31 includes a plurality of conductive first connecting posts 31' that interconnect electrically and respectively the intersections 202 of the first level grid 200 (see FIG. 6) and the fourth conductive posts 42'. The second connecting unit 32 includes a plurality of conductive second connecting posts 32' that interconnect electrically and respectively the intersections 402 of the second level grid 400 (see FIGS. 5 and 7) and the second conductive posts 22'. In this embodiment, each of the first connecting posts 31 is integrally formed with the respective one of the fourth conductive posts 42', and each of the second connecting posts 32 is integrally formed with the respective one of the second conductive posts 22'.

Since each second conductive post 22 has a plurality of faces 221' surrounded by one or more first conductive posts 21 in the capacitor of this invention, the electrode areas of the capacitor are considerably enlarged, thereby eliminating the aforesaid drawbacks associated with the prior art.

While the present invention has been described in connection with what is considered the most practical and preferred embodiments, it is understood that this invention is not limited to the disclosed embodiments but is intended to cover various arrangements included within the spirit and scope of the broadest interpretations and equivalent arrangements.

We claim:

1. A capacitor comprising:

a first level structure including an array of first conductive units, each of which includes a hollow first conductive post that has a plurality of lateral sides, said first conductive posts of said first conductive units being interconnected to form a first level grid that defines a plurality of first level lattices, an array of second conductive units, each of which includes a second conductive post that is disposed in a respective one of said first level lattices and that has a plurality of lateral sides that are surrounded by said lateral sides of said first conductive post of a respective one of said first conductive units, said first conductive post of each of said first conductive units and said second conductive post of the respective one of said second conductive units cooperatively defining a first level charge space therebetween, and a first dielectric material filling said first level charge space.

2. The capacitor of claim 1, wherein said first conductive post of each of said first conductive units is rectangular in shape.

3. The capacitor of claim 2, wherein said second conductive post of each of said second conductive units is rectangular in shape.

4. The capacitor of claim 1, wherein said first level grid of said first level structure defines a plurality of first level intersections, said capacitor further comprising:

a second level structure disposed below said first level structure and including an array of third conductive units, each of which includes a hollow third conductive post that has a plurality of lateral sides, said third conductive posts of said third conductive units being interconnected to form a second level grid that defines a plurality of second level lattices and a plurality of second level intersections, an array of fourth conductive units, each of which includes a fourth conductive post that is disposed in a respective one of said second level lattices and that has a plurality of lateral sides that are surrounded by said lateral sides of said third conductive post of a respective one of said third conductive units, said third conductive post of each of said third conductive units and said fourth conductive post of the respective one of said fourth conductive units cooperatively defining a second level charge space therebetween, and a second dielectric material filling said second level charge space; and a middle level structure interposed between said first and second level structures and including a conductive first connecting unit connected electrically to said fourth conductive units and including a plurality of conductive first connecting posts that interconnect electrically and respectively said inter sections of said first level grid and said fourth conductive posts, and a conductive second connecting unit connected electrically to said second conductive units and including a plurality of conductive second connecting posts that interconnect electrically and respectively said intersections of said second level grid and said second conductive posts.

5. The capacitor of claim 4, wherein said third conductive post of each of said third conductive units is rectangular in shape.

6. The capacitor of claim 5, wherein said fourth conductive post of each of said fourth conductive units is rectangular in shape.

7. The capacitor of claim 6, wherein each of said first connecting posts is integrally formed with the respective one of said fourth conductive posts, and each of said second connecting posts is integrally formed with the respective one of said second conductive posts.

* * * * *